United States Patent [19]

Fang

[11] Patent Number: 4,702,965

[45] Date of Patent: Oct. 27, 1987

[54] LOW VACUUM SILICON THIN FILM SOLAR CELL AND METHOD OF PRODUCTION

[75] Inventor: Pao-Hsien Fang, Belmont, Mass.

[73] Assignee: Richard J. Birch, Wellesley, Mass.; a part interest

[21] Appl. No.: 810,533

[22] Filed: Dec. 17, 1985

Related U.S. Application Data

[63] Continuation of Ser. No. 497,400, May 23, 1983, abandoned, which is a continuation-in-part of Ser. No. 362,798, Mar. 29, 1982, abandoned, which is a continuation of Ser. No. 87,282, Oct. 22, 1979, abandoned.

[51] Int. Cl.$^4$ ................................................ B05D 5/12
[52] U.S. Cl. ...................................... 428/457; 427/38; 427/45.1; 427/51; 427/74; 427/248.1; 427/295; 427/402; 428/688; 428/704; 437/225
[58] Field of Search ....................... 428/457, 688, 704; 427/38, 45.1, 51, 74, 85, 86, 88, 248.1, 295, 402

[56] References Cited

U.S. PATENT DOCUMENTS 4,064,521  12/1977  Carlson ........................... 427/39 X
4,281,208  7/1981  Kuwano et al. ................... 427/47 X

*Primary Examiner*—Bernard D. Pianalto
*Attorney, Agent, or Firm*—Richard J. Birch

[57] ABSTRACT

A method and apparatus for producing thin film silicon solar cells by the deposition of successive passivation and silicon layers in a vacuum of low $10^{-4}$ to high $10^{-5}$ torr is disclosed. The method utilizes three principal sources: a semiconductor, gaseous ion and dopant. Evaporation at low vacuum is achieved by heating solid silicon indirectly in a crucible of refractory material or directly in a crucible of conductive material. Alternatively, the solid silicon can be heated indirectly with rf power. The gaseous plasma and dopant(s) are provided from suitable sources. The result is the deposition of semiconductor material and dopant in the presence of a gaseous plasma at low vacuum. The plasma eliminates contamination from the low vacuum.

7 Claims, No Drawings

LOW VACUUM SILICON THIN FILM SOLAR CELL AND METHOD OF PRODUCTION

CROSS REFERENCE TO RELATED APPLICATIONS

This is a continuation of co-pending application Ser. No. 497,400 filed on May 23, 1983, now abandoned, which is a continuation-in-part application of Ser. No. 362,798 filed Mar. 29, 1982, abandoned, which in turn is a continuation of application Ser. No. 087,282 filed Oct. 22, 1979, abandoned.

BACKGROUND OF THE INVENTION

Solar cell research, development and production are great current technological activities. Two areas which have received attractions are the cost of materials for solar cell production and the efficiency of the solar cell performance. Emphasis has alos been made on the simplification of the production steps. The complexity, the cost and the operation of the involved production equipment do not seem to be the foremost in these considerations. This practice can be traced to the microelectronics technology. Not too many years ago was the birth of the transistors and solar cells and in fact they were essentially the same device. Now transistors have entered a maturity through miniaturization, contracting from millimeter into micrometer in linear dimensions, that is, a $10^3$ folds reduction. On the other hand, the size of the solar cell, because of the very nature of light acceptance thermodynamics and a limited possibility of the augmentation of conversion efficiency, has no alternative but to expand. Current technology expanded solar cells from centimeter by 10 times and arrays of solar cells also by about 10 times. $10^3$ fold enlargement, while a desirable goal, is not in sight. One possible reason is due to a transistor mentality. With this mentality, the expensive equipment and the meticulous processes are naturally accepted based on which the production proceeds.

The present invention is to design an approach which does not involve high technology of sophisticated equipment, and the operational process is simplified but still meets the requirement of basic physics. This invention is a modification of a part of my patent, U.S. Pat. No. 3,914,856, and its continuation to produce a vacuum evaporated thin film solar cell. This modification will be described in several inter-dependent constructions in the following.

Among several approaches to deposit semiconductor films, the vacuum evaporation is unique in three aspects, (i) fast deposition rate with a high percentage of material utilization, (ii) solid silicon is used which represents material and transportation convenience and cost saving, (iii) dopant materials will also be solid with low vapor pressure, thus the interference and contamination between dopands are minimized. In conventional practice, the ambient vacuum is $10^{-6}$ torr or better obtained by a diffusion pump action with cryogenic trapping, typically by liquid introgen or liquid helium. Under this condition, electron beam heating for vaporizing the material is found to be most convenient. There are several deficiencies in this practice:

(1) The cost of the facility and the operation of cryogenic source is expensive;

(2) The cost of electron beam system represents a large portion of the deposition system; and, (3) Due to the involved high voltage operation, there is a radiation damage on the produced device from the electrons and x-rays generated by the electron beam.

The present invention aims to eliminate all these deficiencies through a modification of the processing methods and will be described according to three principal sources, semiconductor, gaseous ion and dopant.

In the following presentation, silicon will be used as a representative semiconductor material. It should be obvious that the same design is applicable to produce thin film solar cells made of materials such as germanium or silicon-germanium combination, selenium, or compound semiconductors. All these materials in solid form can be evaporated in crucibles.

A. Silicon source- If the evaporation is to be carried out at a low vacuum by eliminating the cryogenic facility, electron beam system will arc and spark, also the filament for electron emission will be deteriorated rapidly. Therefore, low vacuum and electron beam evaporation are incompatible. The present modification thus is to replace the electron beam system by several other designs. One design uses a resistive heating of graphite or conductive refractive material such as boron nitride or boron carbide. Another way is to use indirect heating with tungsten basket of the silicon contained crucible such as boron nitride or beryllium oxide. A third way is to heat inductively by introducing a radio frequency coil inside the vacuum system. It is important in all these installations to have a heat removal facility inside the vacuum system. A convenient method will be a closed water cooling shield and water circulated leads of the power carrying conduit.

The vacuum system is to be operated in low $10^{-4}$ to high $10^{-5}$ torr range, a condition can be readily obtained by a mechanical plus an ordinary diffusion pump. This low vacuum will also minimize the pumping time requirement. This low vacuum is adequate for evaporation from the point of view of silicon mean free path. The relation between the mean free path L, in centimeter and the vacuum pressure p in torr is given approximately by:

$$L = 5 \times 10^3/p$$

Thus, when $p = 10^{-4}$ torr, L would be 50 cm, in the practical range of source-substrate separation.

B. Ion Source- The low vacuum represents a presence of various gaseous species in the system and they can react with the evaporation material to render the solar cell to a poor performance. The solar cell made of thin film configuration as described in my pending application actually consists, besides silicon, a small gas component, such as hydrogen, oxygen, nitrogen and so forth, but in an atomic or ionized state instead of a molecular state. This atomic or ionic gas now can be filled in the vacuum system which performs simultaneously two functions, a replacement of undesirable residue in the low vacuum and a purveyor of a small amount of the ingredient to achieve a defect annealing and morphology regulation of the silicon bulk.

The proper amount of this introduced gas will be decided by the amount required in the silicon composition, taken into consideration the concentration of the gas available on the deposted surface and the sticking coefficient.

The source of the gaseous ion is derived in the following manner:

(a) Mechanical construction: (i) Through a leak valve, the molecular gas of about 1 torr pressure is introduced into the vacuum system, (ii) Inside the vacuum system, the outlet of the leak valve is connected to the one end of a tungsten or a tantalum tubing of 1 cm inner diameter, 10 cm long, (iii) inside the tubing is a tungsten filament coil, 5 mm in diameter and 3 cm long, placed about 3 cm from the other end of tungsten tubing, (iv) this other end will closed by a flat tungsten plate with an orifice of 1 mm in diameter.

(b) Electrical connection: There are three electrical connections (i) heating the filament to incandescent temperature to emit electrons from the filament, (ii) a positive voltage with respect to the filament is connected to the tungsten tubing or to a grid inside the tubing to remove the electrons stripped out from hydrogen and to promote a production of hydrogen ions and (iii) a negative potential plate of a 3 mm hole in the center aligned with the center of the orifice of the end plate, with 5 mm separation between the plates, a negative potential is introduced to extract the ions, to orient the ions to the location of the substrate where the deposition is performed.

C. Dopant Source- In order to stress the economy and convenience, dopant source will be in solid form. For n-type dopant, arsenic or antimony metal in resistive heating boat such as tungsten or tantalum boat is satisfactory. For p-type, aluminum or boron can be used. Better uniformity is obtained with boron, however, a very high temperature of 1800° C. is required to evaporate boron.

A practical construction in the laboratory for boron source is to have a graphite rod of 5 mm diameter, 5 cm long, with constricted central portion of about 1 cm long with 2 to 3 mm diameter, with an indented hole to place a small boron piece. The two ends of the rod are tightly wrapped with tantalum foil as electrodes to be connected to heavy copper electrical lead. In order to avoid the excessively high temperature, a source of boron can be boron nitride or boron silicide. In the industrial production, the scale described above can be proportionally enlarged.

With above A, B and C, the principle installation of the solar cell production plant is complete. For the process of solar cell production, the description is contained in my patent application Ser. No. 362,798 filed Mar. 29, 1982 which in turn is a continuation of Ser. No. 087,282 filed Oct. 22, 1979 which are incorporated herein by reference, except that the deposition is to proceed in situ of a gaseous plasma environment instead of an incorporation of the ionized gas through a post annealing.

In the following, an example will be given to produce a heterostructure solar cell made of a superposition of microcrystal silicon onto amorphous silicon:

(i) The steel substrate is placed in a rotary dome inside the vacuum system for evaporation. After a vacuum of high $10^{-5}$ torr range is reached, the substrate is heated to between 250° and 450° C. and the gaseous ion is introduced into the system, then the following layers of materials are consecutively evaporated while a vacuum of a low $10^{-4}$ torr range is maintained:

(ii) a passivation metal layer of 500 Angstroms,
(iii) a n-doped silicon layer of 300 Angstroms,
(iv) an intrinsic silicon layer of 5000 Angstroms, and
(v) a p-doped silicon layer of 30 Angstroms.

(vi) These above silicon layers, because of the low substrate temperature, will be in amorphous form. At the end of (v), the substrate temperature is raised to 630° C. rapidly in a time of 5 to 10 minutes, sufficiently long to establish a thermal equilibrium, but not too long to induce a crystallization of the amorphous layers. After this temperature is established, a p-layer of silicon of a thickness of 500 Angstroms is deposited. This layer, because of the substrate temperature, will be microcrystal.

(vii) At the end of (vi), the temperature is lowered in a hydrogen plasma ambient to 250° C. in 10 to 30 minutes.

(viii) The complete solar cell is made by introducing the top electrode and top surface anti-reflection coating.

In conclusion, while the method employed to produce the individual sources is known in the practice, the combination to produce the desired objective of low technology requirement and low cost effectiveness is the heart of the present invention.

In the aspect of combination of silicon and electron source to produce plasma, it should be pointed out that this is different from the familiar ion plating deposition. The ion plating deposition is consisted of ionizing silicon and accelerating the ionized silicon to attain a high energy. As pointed out in the beginning of this patent description, the objectives of the present work is to have evaporating materials at low energy state to minimize the radiation damage during the processing.

What I claim and desire to secure by Letters Patent of the United States is:

1. A method for producing semiconductor solar cells comprising the steps of:
    establishing a vacuum environment of low $10^{-4}$ to high $10^{-5}$ range;
    positioning a deposition substrate in said vacuum environment;
    introducing a gaseous plasma into said vaccum environment to replace the residual gases therein; and,
    depositing successive passivation and semiconductor layers onto said deposition substrate in the presence of said gaseous plasma with at least some of said semiconductor layers being doped, said semiconductor layers being deposited by evaporation with the semiconductor material forming said semiconductor layers coming from a solid source.

2. The method of claim 1 wherein said semiconductor material is silicon and further comprising the step of producing deposition silicon by indirectly heating solid silicon in a crucible of refractory materials that is heated by heating elements.

3. The method of claim 1 wherein said semiconductor material is silicon and further comprising the step of producing deposition silicon by directly heating solid silicon in a crucible of conductive material by passing an electric current therethrough.

4. The method of claim 1 wherein said semiconductor is silicon and further comprising the step of producing deposition silicon by inductively heating solid silicon.

5. The method of claim 1 further comprising the step of producing said gaseous plasma by passing the gas through a chamber having a heated tungsten element therein which produces electrons to ionize the gas.

6. A method for producing a heterostructure solar cell having microcrystal silicon superposed on amorphous silicon, said method comprising the steps of:
    1. positioning a steel substrate in a vacuum environment;
    2. establishing a vacuum of high $10^{-5}$ torr range and then heating the substrate to between 250° and 45ſ and introducing an ionized gas into said vacuum environment;
3. evaporating and depositing in sequence on the substrate the following layers of materials while a vacuum of a low $10^{-4}$ torr range is maintained:
   (a) a passivation metal layer of 500 Angstroms,
   (b) a n-doped silicon layer of 300 Angstroms,
   (c) an intrinsic silicon layer of 5000 Angstroms; and,
   (d) a p-doped silicon layer of 30 Angstroms.
4. after deposition of the p-doped silicon layer, raising the substrate temperature to 630° C. in a time of 5 to 10 minutes which is sufficiently long to establish a thermal equilibrium, but not too long to induce a crystallization of the amorphous layer of silicon deposited in Step 3;
5. after the 630° C. temperature is reached, depositing a p-layer of microcrystal silicon of a thickness of 500 Angstroms;
6. thereafter, lowering the temperature in a hydrogen plasma ambient to 250° C. in 10 to 30 minutes; and,
7. completing the solar cell by attaching thereto a top electrode.
7. A solar cell produced by the method of claim 6.

* * * * *